United States Patent
Tan et al.

(10) Patent No.: US 10,365,756 B2
(45) Date of Patent: Jul. 30, 2019

(54) HYBRID TRANSMITTER DRIVER

(71) Applicant: PIXART IMAGING (PENANG) SDN. BHD., Penang (MY)

(72) Inventors: Kok-Siang Tan, Penang (MY); Kei-Tee Tiew, Penang (MY)

(73) Assignee: PIXART IMAGING INC., Hsin-Chu, Taiwan (TW)

( * ) Notice: Subject to any disclaimer, the term of this patent is extended or adjusted under 35 U.S.C. 154(b) by 232 days.

(21) Appl. No.: 15/623,063

(22) Filed: Jun. 14, 2017

(65) Prior Publication Data
US 2018/0364852 A1    Dec. 20, 2018

(51) Int. Cl.
*G06F 3/041* (2006.01)
*G06F 3/044* (2006.01)
*G06F 1/3234* (2019.01)
*H03K 17/96* (2006.01)

(52) U.S. Cl.
CPC .......... *G06F 3/0416* (2013.01); *G06F 1/3262* (2013.01); *H03K 17/962* (2013.01); *G06F 3/044* (2013.01)

(58) Field of Classification Search
CPC combination set(s) only.
See application file for complete search history.

(56) References Cited

U.S. PATENT DOCUMENTS

2014/0368467 A1* 12/2014 Park ..................... G06F 3/044
345/174

* cited by examiner

*Primary Examiner* — Priyank J Shah
(74) *Attorney, Agent, or Firm* — Li & Cai Intellectual Property (USA) Office

(57) ABSTRACT

A hybrid transmitter driver works in a first operation mode or a second operation mode and includes an operational amplifier, a pre-driver, a first multiplexer, a second multiplexer and an output stage driver. After receiving a signal from the first signal generator, the operational amplifier outputs a first driving signal and a third driving signal. After receiving a signal from the second signal generator, the pre-driver outputs a second driving signal and a fourth driving signal. In the first operation mode, the first multiplexer outputs the second driving signal and the second multiplexer outputs the fourth driving signal to make the output stage driver output a first transmission signal. In the second operation mode, the first multiplexer outputs the first driving signal and the second multiplexer outputs the third driving signal to make the output stage driver output a second transmission signal.

23 Claims, 3 Drawing Sheets

HYBRID TRANSMITTER DRIVER

BACKGROUND OF THE INVENTION

1. Field of the Invention

The instant disclosure relates to a transmitter driver; in particular, to a hybrid transmitter driver that emits transmission signals having different waveforms in different operation modes.

2. Description of Related Art

Generally speaking, the sensing performance of a capacitive sensing device is highly relevant to the design of pixel cells, the signal receiver architecture, the signal transmitter architecture and the digital signal processing algorithm. In order to make the capacitive sensing device have a better sensitivity and a higher signal-to-noise ratio, instead of using a square wave generator, a sine wave generator is often used as a signal transmitter in a transmitter driver of the capacitive sensing device for lower harmonics and less interferences. In this manner, it will be more effective to differentiate between the real touch signals and unwanted noise signals.

Compared with the square wave generator, the sine wave generator consumes more power. However, for mobile and hand-held applications, the power consumption is directly related to how long the application can run without being charged. Therefore, it would be worthy to consider how the sensitivity and signal-to-noise ratio of the capacitive sensing device can be improved without consuming power quickly.

SUMMARY OF THE INVENTION

The instant disclosure provides a hybrid transmitter driver that is used in a capacitive sensing device. A transmission signal is transmitted from an output end of the hybrid transmitter driver to a signal receiver configured in the capacitive sensing device for touch sensing. This hybrid transmitter driver comprises an operational amplifier, a pre-driver, a first multiplexer, a second multiplexer and an output stage driver. A non-inverting input end of the operational amplifier is connected to a first signal generator, and an inverting input end of the operational amplifier is connected to the output end of the hybrid transmitter driver. After the operational amplifier receives a signal transmitted from the first signal generator, the operational amplifier outputs a first driving signal and a third driving signal. An input end of the pre-driver is connected to a second signal generator. After the pre-driver receives a signal transmitted from the second signal generator, the pre-driver outputs a second driving signal and a fourth driving signal. The first multiplexer is connected to a first output end of the operational amplifier to receive the first driving signal, and is connected to a first output end of the pre-driver to receive the second driving signal. The second multiplexer is connected to a second output end of the operational amplifier to receive the third driving signal, and is connected to a second output end of the pre-driver to receive the fourth driving signal. The output stage driver is connected to the first multiplexer and the second multiplexer. The hybrid transmitter driver works in a first operation mode or a second operation mode. In the first operation mode, the first multiplexer chooses to output the second driving signal and the second multiplexer chooses to output the fourth driving signal to make the output stage driver output a first transmission signal. On the other hand, in the second operation mode, the first multiplexer chooses to output the first driving signal and the second multiplexer chooses to output the third driving signal to make the output stage driver output a second transmission signal.

In one embodiment of the hybrid transmitter driver provided by the instant disclosure, the hybrid transmitter driver works in the second operation mode every time the hybrid transmitter driver is turned on.

The instant disclosure further provides a hybrid transmitter driver that is used in a capacitive sensing device. A transmission signal is transmitted from an output end of the hybrid transmitter driver to a signal receiver configured in the capacitive sensing device for touch sensing. This hybrid transmitter driver comprises an operational amplifier, a pre-driver, a first multiplexer, a second multiplexer and an output stage driver. A non-inverting input end of the operational amplifier is connected to a first signal generator, and an inverting input end of the operational amplifier is connected to the output end of the hybrid transmitter driver. After the operational amplifier receives a signal transmitted from the first signal generator, the operational amplifier outputs a first driving signal and a third driving signal. An input end of the pre-driver is connected to a second signal generator. After the pre-driver receives a signal transmitted from the second signal generator, the pre-driver outputs a second driving signal and a fourth driving signal. The first multiplexer is connected to a first output end of the operational amplifier to receive the first driving signal, and is connected to a first output end of the pre-driver to receive the second driving signal. The second multiplexer is connected to a second output end of the operational amplifier to receive the third driving signal, and is connected to a second output end of the pre-driver to receive the fourth driving signal. The output stage driver is connected to the first multiplexer and the second multiplexer. The hybrid transmitter driver works in a first operation mode or a second operation mode. Every time the hybrid transmitter driver is turned, the hybrid transmitter driver works in the second operation mode. In the second operation mode, the first multiplexer chooses to output the second driving signal and the second multiplexer chooses to output the fourth driving signal to make the output stage driver output a first transmission signal. However, when the signal-to-noise ratio at the output end of the hybrid transmitter driver is equal to or smaller than a threshold ratio, the hybrid transmitter driver turns to work in the second operation mode. In the second operation mode, the first multiplexer chooses to output the first driving signal and the second multiplexer chooses to output the third driving signal to make the output stage driver output a second transmission signal.

In one embodiment of the hybrid transmitter driver provided by the instant disclosure, after the hybrid transmitter driver turns to work in the second operation mode, the hybrid transmitter driver determines a frequency range, such that the second signal generator generates a signal according to the frequency range and the hybrid transmitter driver turns back to work in the first operation mode.

To sum up, the hybrid transmitter driver can work in different operation modes according to the current operation requirements of a capacitive sensing device. In different operation modes, the hybrid transmitter driver takes different types of signal generators as a signal source to match the operation requirements of the capacitive sensing device. For example, sometimes the capacitive sensing device needs to maintain a great sensitivity for repeated touch sensing, and sometimes the capacitive sensing device needs not to maintain a great sensitivity because it enters a standby mode.

For further understanding of the instant disclosure, reference is made to the following detailed description illustrating the embodiments of the instant disclosure. The description is only for illustrating the instant disclosure, and not for limiting the scope of the claim.

BRIEF DESCRIPTION OF THE DRAWINGS

Embodiments are illustrated by way of example and not by way of limitation in the figures of the accompanying drawings, in which like reference numerals indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present invention. As used herein, the term "and/or," includes any and all combinations of one or more of the associated listed items.

In order to improve the performance of a capacitive sensing device by having a better sensitivity and a higher signal-to-noise ratio without consuming power of the battery quickly, a hybrid transmitter driver is provided by the instant disclosure. This hybrid transmitter driver can work in different operation modes. In different operation modes, the hybrid transmitter driver chooses different types of signal generators as the signal transmitter according to current operation requirements of the capacitive sensing device.

[One Embodiment of the Capacitive Sensing Device]

Figure 1:
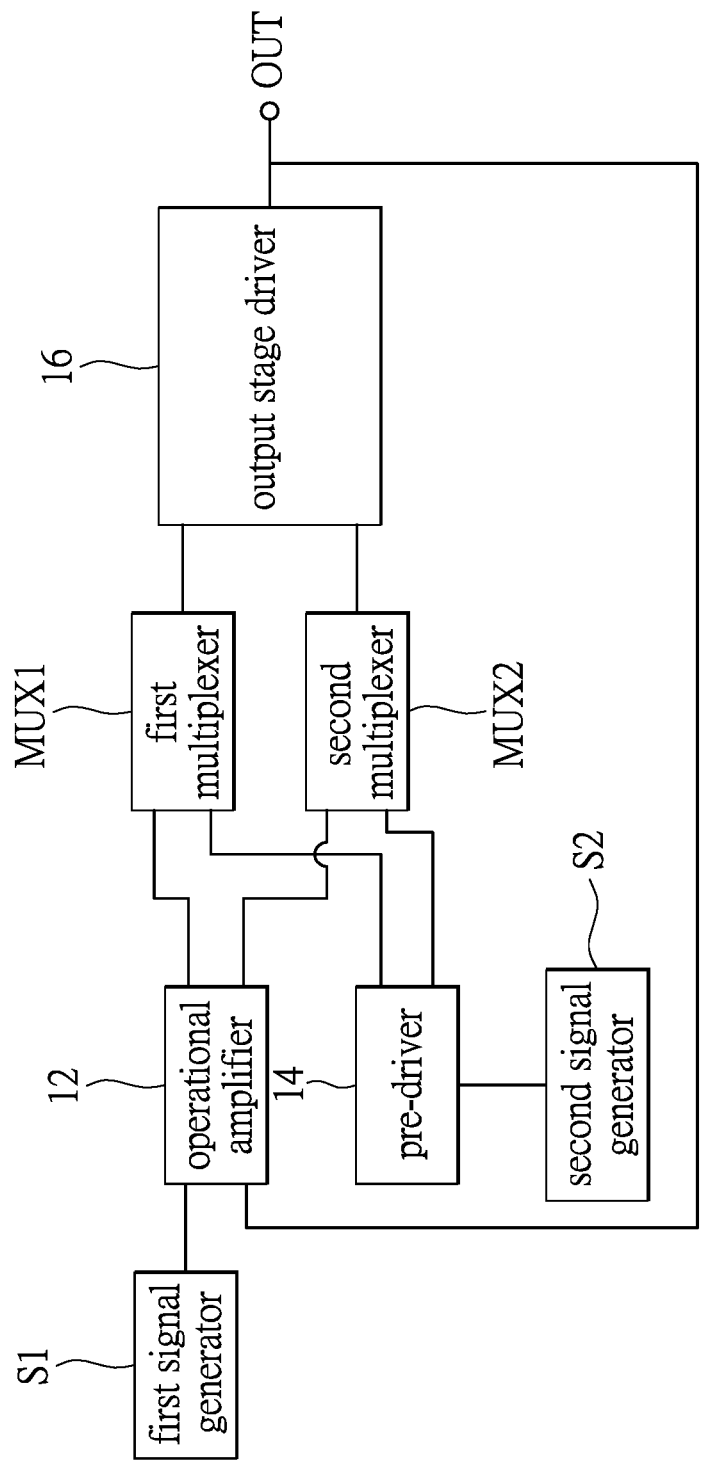
FIG. 1 shows a block diagram of a hybrid transmitter driver according to one embodiment of the instant disclosure.

Referring to FIG. 1, a block diagram of a hybrid transmitter driver of one embodiment of the instant disclosure is shown. The hybrid transmitter driver in this embodiment is configured in a capacitive sensing device. A transmission signal is transmitted from an output end OUT of the hybrid transmitter driver to a signal receiver configured in the capacitive sensing device for touch sensing.

As shown in FIG. 1, the hybrid transmitter driver comprises an operational amplifier 12, a pre-driver 14, a first multiplexer MUX1, a second multiplexer MUX2 and an output stage driver 16.

The operational amplifier 12 has an inverting input end, a non-inverting input end, a first output end and a second output end. The non-inverting input end of the operational amplifier 12 is connected to a first signal generator S1, and the inverting input end of the operational amplifier 12 is connected to the output end OUT of the hybrid transmitter driver. The pre-driver 14 has an input end, a first output end and a second output end. The input end of the pre-driver 14 is connected to a second signal generator S2. The first multiplexer MUX1 is connected to the first output end of the operational amplifier 12, and the first multiplexer MUX1 is also connected to the first output end of the pre-driver 14. The second multiplexer MUX2 is connected to the second output end of the operational amplifier 12, and the second multiplexer MUX2 is also connected to the second output end of the pre-driver 14. The output stage driver 16 is connected to the first multiplexer MUX1 and the second multiplexer MUX2. It is worth mentioning that, the feedback loop consisted of the first signal generator S1, the operational amplifier 12 and the output end OUT of the hybrid transmitter driver can be considered a unit gain amplifier.

In this embodiment, the first signal generator S1 is a sine wave generator, and the second signal generator S2 is a square wave generator; however, it is not limited herein. As mentioned, taking a sine wave generator as a signal source of the hybrid transmitter driver makes the capacitive sensing device have a better sensitivity and a higher signal-to-noise ratio. However, compared with the square wave generator, the sine wave generator consumes much power when working, and may quickly drain the battery power of the capacitive sensing device. To make the capacitive sensing device have a better sensitivity and decrease the power consumption of the hybrid transmitter driver, the hybrid transmitter driver in this embodiment works in different operation modes according to current operation requirements of the capacitive sensing device. In different operation modes, the hybrid transmitter driver chooses a sine wave generator or a square wave generator as the signal transmitter.

Figure 2:
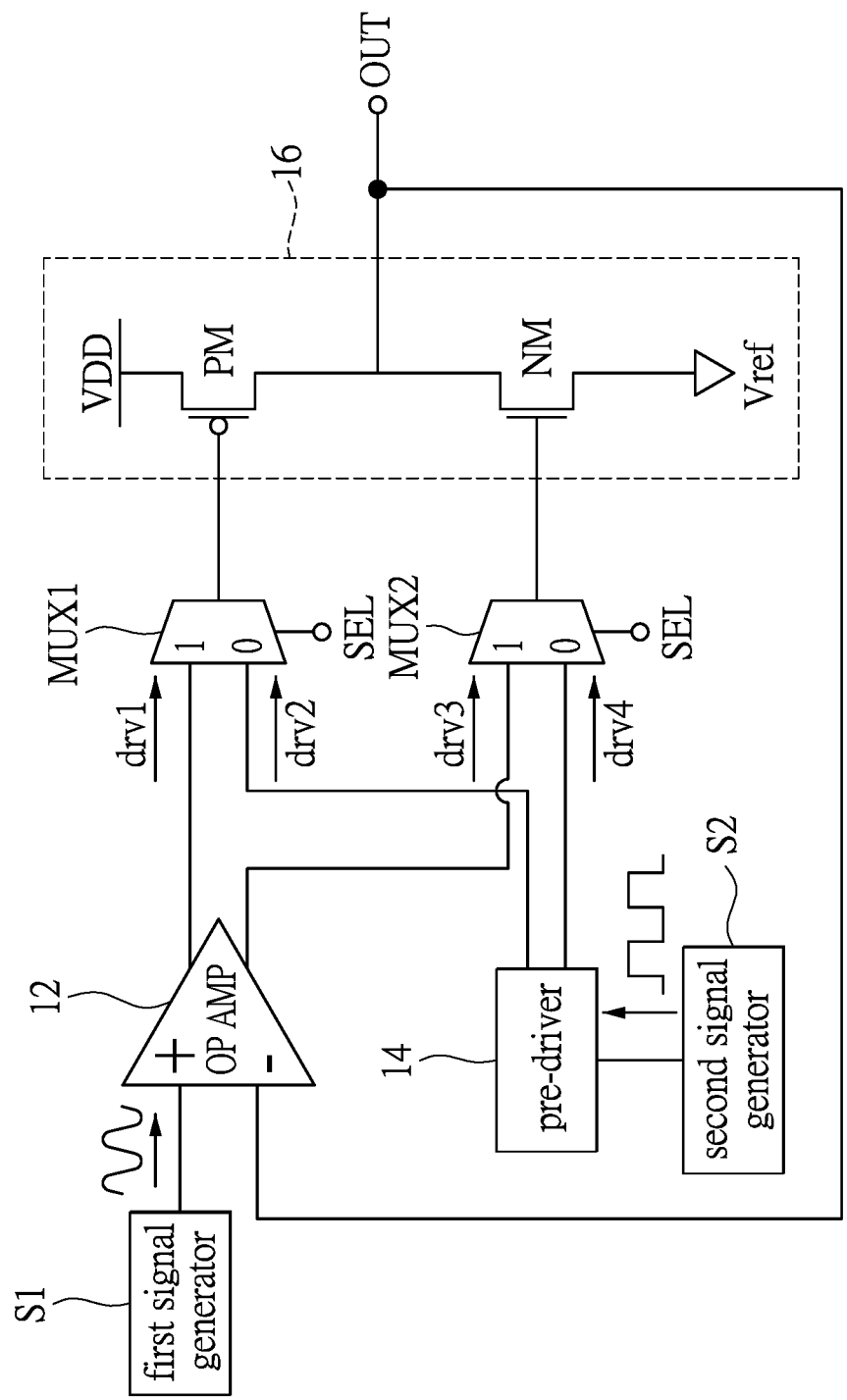
FIG. 2 shows a schematic diagram of a hybrid transmitter driver according to one embodiment of the instant disclosure.

In the following description, the working principle of the hybrid transmitter driver is illustrated and clearly represented by FIG. 2. FIG. 2 shows a schematic diagram of a hybrid transmitter driver of one embodiment of the instant disclosure.

As shown in FIG. 2, the first multiplexer MUX1 has a first input pin, a second input pin, a select pin SEL and an output end. The first input pin of the first multiplexer MUX1 is connected to the first output end of the operational amplifier 12, and the second input pin of the first multiplexer MUX1 is connected to the first output end of the pre-driver 14. The second multiplexer MUX2 has a first input pin, a second input pin, a select pin SEL and an output end. In addition, the first input pin of the second multiplexer MUX2 is connected to the second output end of the operational amplifier 12, and the second input pin of the second multiplexer MUX2 is connected to the second output end of the pre-driver 14.

Based on the current operation requirements of the capacitive sensing device, the hybrid transmitter driver can work in different operation modes to make the output stage driver 16 output different types of transmission signals according to the signal generated from a sine wave generator or a square wave generator. In the following description, how the hybrid transmitter driver controls the output stage driver 16 in different operation modes to output different types of transmission signals according to the signal generated from a sine wave generator or a square wave generator will be illustrated.

According to FIG. 2, after the operational amplifier 12 receives a sine wave signal via its non-inverting input end, the operational amplifier 12 outputs a first driving signal drv1 from its first output end and outputs a third driving signal drv3 from its second output end. After the pre-driver 14 receives a square wave signal via its input end, the pre-driver 14 outputs a second driving signal drv2 from its first output end and outputs a fourth driving signal drv4 from its second output end. The first driving signal drv1 is provided to the first input pin of the first multiplexer MUX1, and the second driving signal drv2 is provided to the second input pin of the first multiplexer MUX1. In addition, the third driving signal drv3 is provided to the first input pin of the second multiplexer MUX2, and the fourth driving signal drv4 is provided to the second input pin of the second multiplexer MUX2.

After that, the select pin SEL of the first multiplexer MUX1 and the select pin SEL of the second multiplexer MUX2 respectively receive a select signal. For the first multiplexer MUX1, when the received select signal is at high level (as labeled by "1" in FIG. 2), the first input pin of the first multiplexer MUX1 is turned on. Thus, the first multiplexer MUX1 outputs the first driving signal drv1 from its output end. On the contrary, when the received select signal is at low level (as labeled by "0" in FIG. 2), the second input pin of the first multiplexer MUX1 is turned on. Thus, the first multiplexer MUX1 outputs the second driving signal drv2 from its output end. For the second multiplexer MUX2, when the received select signal is at high level (as labeled by "1" in FIG. 2), the first input pin of the second multiplexer MUX2 is turned on. Thus, the second multiplexer MUX2 outputs the third driving signal drv3 from its output end. On the contrary, when the received select signal is at low level (as labeled by "0" in FIG. 2), the second input pin of the second multiplexer MUX2 is turned on. Thus, the second multiplexer MUX2 outputs the fourth driving signal drv4 from its output end.

It should be noted that, the select signals received by the first multiplexer MUX1 and the second multiplexer MUX2 may come from difference signal sources. In this case, the select signals received by the first multiplexer MUX1 and the second multiplexer MUX2 may both receive a select signal at low level or a select signal at high level, or one of the first multiplexer MUX1 and the second multiplexer MUX2 may receive a select signal at high level and the other may receive a select signal at low level. In other words, because the select signals received by the first multiplexer MUX1 and the second multiplexer MUX2 may come from difference signal sources, the first multiplexer MUX1 and the second multiplexer MUX2 can be simultaneously turned on or turned off, or one of the first multiplexer MUX1 and the second multiplexer MUX2 is turned on and the other is not.

Since the operation speed of the first multiplexer MUX1 and the second multiplexer MUX2 can be very high, the input of the output stage driver 16 can be switched between the first signal generator S1 and the second signal generator S2 through the first multiplexer MUX1 and the second multiplexer MUX2 while the first signal generator S1 and the second signal generator S2 are turned on at the same time.

However, to reduce power consumption, the first signal generator S1 and the second signal generator S2 could also be turned on alternatively according to the select signal. In one embodiment, the first signal generator S1 and the second signal generator S2 receive one select signal, and the first signal generator S1 and the second signal generator S2 are both turned on at beginning. One of the first signal generator S1 and the second signal generator S2 will be turned off according to the received select signal. For example, if the select signal provided to the first signal generator S1 and the second signal generator S2 are at low level, then the first signal generator S1 will be turned off, but if the select signal provided to the first signal generator S1 and the second signal generator S2 are at high level, then the second signal generator S2 will be turned off.

When the hybrid transmitter driver is working in the first operation mode, the select signal provided to the first multiplexer MUX1 and the select signal provided to the second multiplexer MUX2 are at low level. In this situation, according to the above description, the first multiplexer MUX1 outputs the second driving signal drv2 from its output end, and the second multiplexer MUX2 outputs the fourth driving signal drv4 from its output end, to make the output stage driver 16 output a first transmission signal. Also according to the above description, the first transmission signal output by the output stage driver 16, which is controlled by the second driving signal drv2 and the fourth driving signal drv4, is a square wave signal.

On the other hand, when the hybrid transmitter driver is working in the second operation mode, the select signal provided to the first multiplexer MUX1 and the select signal provided to the second multiplexer MUX2 are at high level. In this situation, according to the above description, the first multiplexer MUX1 outputs the first driving signal drv1 from its output end, and the second multiplexer MUX2 outputs the third driving signal drv3 from its output end, to make the output stage driver 16 output a second transmission signal. Also according to the above description, the second transmission signal output by the output stage driver 16, which is controlled by the first driving signal dry 1 and the third driving signal drv3, is a sine wave signal.

Therefore, when a better sensitivity of the capacitive sensing device is required, the select signals SEL provided to the first multiplexer MUX1 and the second multiplexer MUX2 in the hybrid transmitter driver are at high level, such that the transmission signal output by the hybrid transmitter driver can be a sine wave. It should be noted that, there can be a plurality of driving frequencies provided by taking a sine wave generator as a signal source of the transmitter driver. Thus, if there is no specific noise source detected in the operation environment of the capacitive sensing device, the hybrid transmitter driver chooses to work in the second operation mode. For example, every time when the capacitive sensing device is turned on and the hybrid transmitter driver starts to work, there is no specific noise source detected, so that the hybrid transmitter driver chooses to work in the second operation mode.

On the other hand, when the capacitive sensing device needs not perform lots of touch sensing, the select signals provided to the first multiplexer MUX1 and the second multiplexer MUX2 in the hybrid transmitter driver are at low level, such that the transmission signal output by the hybrid transmitter driver can be a square wave to decrease the power consumption of the hybrid transmitter driver. For example, when the capacitive sensing device enters a standby mode, the capacitive sensing device needs not perform lots of touch sensing, so that the select signals provided to the first multiplexer MUX1 and the second multiplexer MUX2 in the hybrid transmitter driver changes to be at low level.

In other words, in this embodiment, according to the select signal, which may be at high level or low level, the hybrid transmitter driver can be switched between different operation modes to provide a better sensing performance and to ensure a lesser power consumption.

Finally, in the following description, an example for illustrating the configuration and the working principle of the output stage driver 16 in the hybrid transmitter driver provided in this embodiment is set forth. However, the configuration and the working principle of the output stage driver 16 in this disclosure are not restricted thereto.

As shown in FIG. 2, the output stage driver 16 can include a PMOS transistor PM and a NMOS transistor NM. A source of the PMOS transistor PM is connected to a supplied voltage VDD, a gate of the PMOS transistor PM is connected to the output end of the first multiplexer MUX1, and a drain of the PMOS transistor PM is connected to the output end OUT of the hybrid transmitter driver. Additionally, the drain of the NMOS transistor NM is connected to the drain of the PMOS transistor PM and the output end OUT of the hybrid transmitter driver, the gate of the NMOS transistor NM is connected to the output end of the second multiplexer MUX2, and the source of the NMOS transistor NM is connected to a reference voltage Vref. It should be noted that, in other embodiments in which the output stage driver 16 has a similar configuration as described, the source of the NMOS transistor NM can be grounded.

As mentioned, when the hybrid transmitter driver is working in the first operation mode, the select signal provided to the first multiplexer MUX 1 and the select signal provided to the second multiplexer MUX2 are at low level. Thus, the second driving signal drv2 is outputted from the output end of the first multiplexer MUX 1, and the fourth driving signal drv4 is outputted from the output end of the second multiplexer MUX2. The second driving signal drv2 drives the PMOS transistor PM alternately, and the fourth driving signal drv4 drives the NMOS transistor NM alternately, such that the hybrid transmitter driver can output a square wave from its output end OUT as the transmission signal. On the other hand, when the hybrid transmitter driver is working in the second operation mode, the select signal provided to the first multiplexer MUX 1 and the select signal provided to the second multiplexer MUX2 are at high level. Thus, the first driving signal drv1 is outputted from the output end of the first multiplexer MUX 1, and the third driving signal drv3 is outputted from the output end of the second multiplexer MUX2. The first driving signal drv1 drives the PMOS transistor PM alternately, and the third driving signal drv3 drives the NMOS transistor NM alternately, such that the hybrid transmitter driver can output a sine wave from its output end OUT as the transmission signal. It should be noted that, in another embodiment, when the hybrid transmitter driver is working in the second operation mode, the PMOS transistor PM and the NMOS transistor NM can both be driven respectively by the first driving signal drv1 and the third driving signal drv3.

It is worth mentioning that, in this embodiment, the first signal generator S1 (e.g. a sine wave generator) and the second signal generator S2 (e.g. a square wave generator) share the same output stage driver 16. In this manner, lots of circuit area is saved (herein, the circuit refers to the silicon area). For a transmitter driver that can only emit one kind of signal, the circuit area of the transmitter driver using a square wave generator as a signal source could be twice that of the circuit area of the transmitter driver using a sine wave generator as a signal source. However, the circuit area of the hybrid transmitter driver provided by the instant disclosure is about the same size as the circuit area of the transmitter driver using a square wave generator as a signal source. In other words, the circuit area of the hybrid transmitter driver provided by the instant disclosure is much less than the total circuit area of the transmitter driver using a square wave generator as a signal source and the transmitter driver using a sine wave generator as a signal source.

The output stage driver 16 may include a plurality of output stage units, which can be implemented by several pairs of PMOS transistor PM and NMOS transistor NM, to cater for different impedances within an impedance range, for example, 50 ohm-200 ohm, and thus the output stage driver 16 will be large. To drive each output stage unit of the output stage driver 16, a plurality of pre-drivers 14 are needed.

Figure 3:
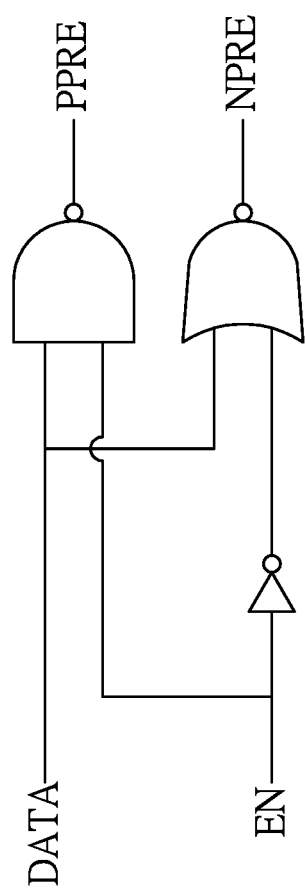
FIG. 3 shows a schematic diagram of a pre-driver of according to one embodiment of the instant disclosure.

Referring to FIG. 3, a schematic diagram of a pre-driver of according to one embodiment of the instant disclosure is shown. Each pre-driver 14 includes a NAND gate and a NOR gate. As shown in FIG. 3, one input end of the NAND gate receives a data signal DATA, which is a square wave signal, and the other input end of the NAND gate receives an enable signal EN. In addition, one input end of the NOR gate receives the data signal DATA and the other input end of the NOR gate receives an inversed enable signal EN. According to the enable signal EN, each pre-driver 14 can drive or shut down one corresponding output stage unit of the output stage driver 16. Therefore, when certain output stage unit of the output stage driver 16 is not used, the corresponding pre-driver 14 can shut down that output stage unit according to the enable signal EN. Specifically speaking, when certain output stage unit of the output stage driver 16 should be shut down, the corresponding pre-driver 14 receives an enable signal EN at low level. Due to the enable signal EN at low level, the NAND gate outputs a pre-driving signal PPRE at high level and the NOR gate outputs a pre-driving signal NPRE at low level, such that the PMOS transistor PM and the NMOS transistor NM of the output stage unit are both off, and thus the output stage unit is shut down.

In order to further illustrate the hybrid transmitter driver provided by the instant disclosure, another embodiment is provided in the following description.

[Another Embodiment of the Capacitive Sensing Device]

The hybrid transmitter driver provided in this embodiment and the hybrid transmitter driver provided in the previous embodiment have similar circuit configurations and working principles. Thus, please refer to both of FIG. 1 and FIG. 2 for easy reference.

Similar to the hybrid transmitter driver provided in the previous embodiment, in this embodiment, when the hybrid transmitter driver is working in a first operation mode, the first multiplexer MUX1 chooses to output a second driving signal drv2 and the second multiplexer MUX2 chooses to output a fourth driving signal drv4, to make the output stage driver 16 output a transmission signal which is a square wave signal.

However, different from the hybrid transmitter driver provided in the previous embodiment, in this embodiment, when the hybrid transmitter driver is working in the first operation mode, if the signal-to-noise ratio at the output end of the hybrid transmitter driver is equal to or less than a threshold ratio due to there being too many noises in the operation environment of the capacitive sensing device, a select signal provided to the first multiplexer MUX1 and a select signal provided to the second multiplexer MUX2 are automatically switched. Specifically, the select signal provided to both the first multiplexer MUX1 and the second multiplexer MUX2 changes to be at high level, such that the hybrid transmitter driver turns to work in a second operation mode. In the second operation mode, the first multiplexer MUX1 chooses to output a first driving signal dry 1 and the second multiplexer MUX2 chooses to output a third driving signal drv3, to make the output stage driver 16 output a transmission signal which is a sine wave signal.

As mentioned, there can be a plurality of driving frequencies provided by taking a sine wave generator as a signal source of the transmitter driver. Thus, after the hybrid transmitter driver turns to work in the second operation mode, the hybrid transmitter driver soon determines a range of target frequency which the hybrid transmitter driver can normally work at in the current operation environment. Finally, when the range of target frequency is determined, the select signal provided to both the first multiplexer MUX1 and the second multiplexer MUX2 is again automatically switched. Specifically, the select signal provided to both the first multiplexer MUX1 and the second multiplexer MUX2 changes to be at low level, such that the hybrid transmitter driver again works in the first operation mode. Under this circumstance, the square wave generator generates a square wave as a signal input of the hybrid transmitter driver according to the determined range of target frequency. It is worth mentioning that, the reason why the hybrid transmitter driver eventually works in the first operation mode is that taking a square wave generator as a signal source of the hybrid transmitter driver makes the hybrid transmitter driver output a transmission signal having a greater strength.

Basically, the feature of the hybrid transmitter driver provided by the instant disclosure is that, the hybrid transmitter driver can work in different operation modes according to current operation requirements of a capacitive sensing device. In different operation modes, the hybrid transmitter driver takes various types of signal generators as a signal source to match the operation requirements of the capacitive sensing device. For example, sometimes the capacitive sensing device needs to maintain a great sensitivity to perform lots of touch sensing, and sometimes the capacitive sensing device needs not maintain a great sensitivity because it enters a standby mode.

In addition, in the hybrid transmitter driver provided by the instant disclosure, two signal generators (e.g. a square wave generator and a sine wave generator) share the same output stage driver, thus saving lots of circuit area (herein, the circuit refers to the silicon area). The circuit area of the hybrid transmitter driver provided by the instant disclosure is approximately 33% less than the total circuit area of the transmitter driver using a square wave generator as a signal source and the transmitter driver using a sine wave generator as a signal source.

Furthermore, the hybrid transmitter driver can work in different operation modes according to the current operation requirements of the capacitive sensing device, so that compared with a total power consumption of the transmitter driver using a square wave generator as a signal source and the transmitter driver using a sine wave generator as a signal source, the hybrid transmitter driver provided by the instant disclosure consumes less power.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A hybrid transmitter driver, used in a capacitive sensing device, comprising:
    an operational amplifier, having a non-inverting input end connected to a first signal generator and having an inverting input end connected to the output end of the hybrid transmitter driver;
    a pre-driver, having an input end connected to a second signal generator;
    a first multiplexer, connected to an first output end of the operational amplifier and connected to an first output end of the pre-driver;
    a second multiplexer, connected to an second output end of the operational amplifier and connected to an second output end of the pre-driver; and
    an output stage driver, connected to the first multiplexer and the second multiplexer.

2. The hybrid transmitter driver according to claim 1, wherein after the operational amplifier receives a signal transmitted from the first signal generator, and the operational amplifier outputs a first driving signal and a third driving signal.

3. The hybrid transmitter driver according to claim 2, wherein after the pre-driver receives a signal transmitted from the second signal generator, the pre-driver outputs a second driving signal and a fourth driving signal.

4. The hybrid transmitter driver according to claim 3,
    wherein the first multiplexer receives the first driving signal and the second driving signal, and the second multiplexer receives the third driving signal and the fourth driving signal;
    wherein the hybrid transmitter driver works in a first operation mode or a second operation mode, and wherein in the first operation mode, the first multiplexer chooses to output the second driving signal and the second multiplexer chooses to output the fourth driving signal to make the output stage driver output a first capacitive sensing signal, but in the second operation mode, the first multiplexer chooses to output the first driving signal and the second multiplexer chooses to output the third driving signal to make the output stage driver output a second capacitive sensing signal.

5. The hybrid transmitter driver according to claim 4,
    wherein the first multiplexer has a first input pin connected to the first output end of the operational amplifier to receive the first driving signal, and has a second input pin connected to the first output end of the pre-driver to receive the second driving signal;
    wherein the second multiplexer has a first input pin connected to the second output end of the operational amplifier to receive the second driving signal, and has a second input pin connected to the second output end of the pre-driver to receive the fourth driving signal;
    wherein the first multiplexer and the second multiplexer respectively have a select pin to receive a select signal, so that the first multiplexer and the second multiplexer respectively chooses to output different driving signals to make the output stage driver output the first transmission signal or the second transmission signal.

6. The hybrid transmitter driver according to claim 5, wherein in the first operation mode, the select signal is at low level, so that the second driving signal is outputted from an output end of the first multiplexer and the fourth driving signal is outputted from an output end of the second multiplexer to make the output stage driver output the first transmission signal, but in the second operation mode, the select signal is at high level, so that the first driving signal is outputted from the output end of the first multiplexer and the third driving signal is outputted from the output end of the second multiplexer to make the output stage driver output the second transmission signal.

7. The hybrid transmitter driver according to claim 6, wherein the output stage driver comprises:

a PMOS transistor, having a source connected to a supply voltage, having a gate connected to the output end of the first multiplexer and having a drain connected to the output end of the hybrid transmitter driver; and a NMOS transistor, having a drain connected to the drain of the PMOS transistor and the output end of the hybrid transmitter driver, having a gate connected to the output end of the second multiplexer and having a source connected to a reference voltage or a grounding end.

8. The hybrid transmitter driver according to claim 7, wherein in the first operation mode, the PMOS transistor and the NMOS transistor are alternately driven according to the second driving signal and the fourth driving signal, such that the first transmission signal is transmitted from the output end of the hybrid transmitter driver.

9. The hybrid transmitter driver according to claim 7, wherein in the second operation mode, the PMOS transistor and the NMOS transistor are alternately driven turn according to the first driving signal and the third driving signal, such that the second transmission signal is transmitted from the output end of the hybrid transmitter driver.

10. The hybrid transmitter driver according to any of claim 1, wherein the first signal generator is a sine wave generator and the second transmission signal is a sine wave signal, and the second signal generator is a square wave generator and the first transmission signal is a square wave signal.

11. The hybrid transmitter driver according to claim 10, wherein the hybrid transmitter driver works in the second operation mode every time the hybrid transmitter driver is turned on.

12. A hybrid transmitter driver, used in a capacitive sensing device, comprising:
an operational amplifier, having a non-inverting input end connected to a first signal generator and having an inverting input end connected to the output end of the hybrid transmitter driver;
a pre-driver, having an input end connected to a second signal generator;
a first multiplexer, connected to an first output end of the operational amplifier and connected to an first output end of the pre-driver;
a second multiplexer, connected to an second output end of the operational amplifier and connected to an second output end of the pre-driver; and
an output stage driver, connected to the first multiplexer and the second multiplexer.

13. The hybrid transmitter driver according to claim 12, wherein after the operational amplifier receives a signal transmitted from the first signal generator, the operational amplifier outputs a first driving signal and a third driving signal.

14. The hybrid transmitter driver according to claim 13, wherein after the pre-driver receives a signal transmitted from the second signal generator, the pre-driver outputs a second driving signal and a fourth driving signal.

15. The hybrid transmitter driver according to claim 14, wherein the first multiplexer receives the first driving signal and the second driving signal, and the second multiplexer receives the third driving signal and the fourth driving signal;
wherein the hybrid transmitter driver works in a first operation mode or a second operation mode, wherein every time the hybrid transmitter driver is turned on, the hybrid transmitter driver works in the first operation mode, and wherein in the first operation mode, the first multiplexer chooses to output the second driving signal and the second multiplexer chooses to output the fourth driving signal to make the output stage driver output a first capacitive sensing signal, but when the signal-to-noise ratio at the output end of the hybrid transmitter driver is equal to or smaller than a threshold ratio, the hybrid transmitter driver turns to work in the second operation mode, and in the second operation mode, the first multiplexer chooses to output the first driving signal and the second multiplexer chooses to output the third driving signal to make the output stage driver output a second capacitive sensing signal.

16. The hybrid transmitter driver according to claim 15, wherein after the hybrid transmitter driver turns to work in the second operation mode, the hybrid transmitter driver determines a frequency range, such that the second signal generator generates a signal according to the frequency range and the hybrid transmitter driver turns back to work in the first operation mode.

17. The hybrid transmitter driver according to claim 16, wherein the first multiplexer has a first input pin connected to the first output end of the operational amplifier to receive the first driving signal, and has a second input pin connected to the first output end of the pre-driver to receive the second driving signal;
wherein the second multiplexer has a first input pin connected to the second output end of the operational amplifier to receive the second driving signal, and has a second input pin connected to the second output end of the pre-driver to receive the fourth driving signal;
wherein the first multiplexer and the second multiplexer respectively have a select pin to receive a select signal, so that the first multiplexer and the second multiplexer respectively choose different driving signals to make the output stage driver output the first transmission signal or the second transmission signal.

18. The hybrid transmitter driver according to claim 17, wherein in the first operation mode, the select signal is at low level, so that the second driving signal is outputted from an output end of the first multiplexer and the fourth driving signal is outputted from an output end of the second multiplexer to make the output stage driver output the first transmission signal, but in the second operation mode, the select signal is at high level, so that the first driving signal is outputted from the output end of the first multiplexer and the third driving signal is outputted from the output end of the second multiplexer to make the output stage driver output the second transmission signal.

19. The hybrid transmitter driver according to claim 12, wherein the output stage driver comprises:
a PMOS transistor, having a source connected to a supply voltage, having a gate connected to the output end of the first multiplexer and having a drain connected to the output end of the hybrid transmitter driver; and
a NMOS transistor, having a drain connected to the drain of the PMOS transistor and the output end of the hybrid transmitter driver, having a gate connected to the output end of the second multiplexer and having a source connected to a reference voltage or a grounding end.

20. The hybrid transmitter driver according to claim 13, wherein in the first operation mode, the PMOS transistor and the NMOS transistor are alternately driven according to the second driving signal and the fourth driving signal, such that the first transmission signal is transmitted from the output end of the hybrid transmitter driver.

21. The hybrid transmitter driver according to claim 13, wherein in the second operation mode, the PMOS transistor and the NMOS transistor are alternately driven according to the first driving signal and the third driving signal, such that the second transmission signal is transmitted from the output end of the hybrid transmitter driver.

22. The hybrid transmitter driver according to any of claim 9, wherein the first signal generator is a sine wave generator and the second transmission signal is a sine wave signal, and the second signal generator is a square wave generator and the first transmission signal is a square wave signal.

23. A hybrid transmitter driver, used in a capacitive sensing device, comprising:
- an operational amplifier, having a non-inverting input end connected to a first signal generator and having an inverting input end connected to the output end of the hybrid transmitter driver;
- a pre-driver, having an input end connected to a second signal generator;
- a first multiplexer, connected to an first output end of the operational amplifier and connected to an first output end of the pre-driver;
- a second multiplexer, connected to an second output end of the operational amplifier and connected to an second output end of the pre-driver; and
- an output stage driver, connected to the first multiplexer and the second multiplexer;
- wherein one of the first signal generator and the second signal generator is driven by a control signal, and the control signal is generated by the capacitive sensing device according to an operation condition of the capacitive sensing device.

* * * * *